United States Patent
Ko

(10) Patent No.: US 8,183,768 B2
(45) Date of Patent: May 22, 2012

(54) ORGANIC LIGHT EMITTING DISPLAY APPARATUS HAVING PIXELS WITH INCREASED APERTURE RATIO

(75) Inventor: Jung-Woo Ko, Yongin (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 174 days.

(21) Appl. No.: 12/461,140

(22) Filed: Aug. 3, 2009

(65) Prior Publication Data
US 2010/0270912 A1    Oct. 28, 2010

(30) Foreign Application Priority Data
Apr. 28, 2009 (KR) .................. 10-2009-0037107

(51) Int. Cl.
*H05B 33/00* (2006.01)
*H01J 1/62* (2006.01)

(52) U.S. Cl. ........ 313/506; 313/504; 313/500; 428/690; 428/917

(58) Field of Classification Search ........... 313/500–506
See application file for complete search history.

(56) References Cited

U.S. PATENT DOCUMENTS
2005/0151462 A1* 7/2005 Miyagawa ............ 313/500
2008/0231554 A1* 9/2008 Lee .......................... 345/63

FOREIGN PATENT DOCUMENTS
JP 2002-299051 A 10/2002
JP 2004-207126 A 7/2004
KR 10 2007-0071080 A 7/2007
KR 10 2008-0002024 A 1/2008

OTHER PUBLICATIONS

Machine English translation of KR 10-2007-0071080 to Ahn et al. published Jul. 4, 2007.*
Korean Notice of Allowance in KR 10-2009-0037107, dated Aug. 23, 2011 (KO).

* cited by examiner

*Primary Examiner* — Sikha Roy
(74) *Attorney, Agent, or Firm* — Lee & Morse, P.C.

(57) ABSTRACT

An organic light emitting display apparatus including a plurality of pixels, wherein each pixel includes a first electrode, a second electrode facing the first electrode, and an intermediate layer disposed between the first and second electrodes and including a plurality of layers including a light emitting layer, at least two pixels adjacent in a first direction form a pixel group, and at least one of the layers of the intermediate layer of the at least two adjacent pixels of the pixel group is integrated, and a distance between pixels in the pixel group is smaller than a distance between adjacent pixel groups.

10 Claims, 7 Drawing Sheets

ORGANIC LIGHT EMITTING DISPLAY APPARATUS HAVING PIXELS WITH INCREASED APERTURE RATIO

BACKGROUND

1. Field

Embodiments relate to an organic light emitting display apparatus.

2. Description of the Related Art

An organic light emitting display apparatus may have a wide viewing angle, excellent contrast, and a quick response speed, and thus is attracting attention as a next generation display apparatus.

Generally, an organic light emitting display apparatus may have a stacked structure, e.g., in which a light emitting layer is disposed between an anode and a cathode. The organic light emitting display apparatus may realize colored light via a principle that a hole and an electron from the anode and the cathode combine in the light emitting layer, and the combination emits light. However, it may be difficult to obtain high efficiency light emission via such a stacked structure, and thus intermediate layers, e.g., an electron injection layer, an electron transport layer, a hole transport layer, and a hole injection layer, may be selectively disposed between the anode and cathode, in addition to the light emitting layer.

SUMMARY

Embodiments are therefore directed to an organic light emitting display apparatus, which substantially overcomes one or more of the problems due to the limitations and disadvantages of the related art.

It is therefore a feature of an embodiment to provide an organic light emitting display apparatus that maximizes product durability and productivity by increasing an aperture ratio of each pixel and/or sub-pixel.

It is therefore another feature of an embodiment to provide an organic light emitting display apparatus that has high resolution due to an increased aperture ratio and may be mass-produced.

At least one of the above and other features and advantages may be realized by providing an organic light emitting display apparatus including a plurality of pixels, wherein each pixel includes a first electrode, a second electrode facing the first electrode, and an intermediate layer disposed between the first and second electrodes and including a plurality of layers including a light emitting layer, at least two pixels adjacent in a first direction form a pixel group, at least one of the layers of the intermediate layer of the at least two adjacent pixels of the pixel group is integrated, and a distance between pixels in the pixel group is smaller than a distance between adjacent pixel groups.

The pixel group may include two to four pixels adjacent in the first direction, and at least one of the layers of the intermediate layer of the pixel group may be integrated.

The integrated layers may be disposed in a zigzag configuration along a second direction perpendicular to the first direction.

The integrated layer may be the light emitting layer.

At least one of the above and other features and advantages may also be realized by providing an organic light emitting display apparatus including a plurality of pixels, wherein each pixel includes sub-pixels, each sub-pixel emits red, green, or blue light, the sub-pixels are disposed to emit the same color light along a first direction, each sub-pixel includes a first electrode, a second electrode facing the first electrode, and an intermediate layer disposed between the first and second electrodes and including a plurality of layers including a light emitting layer, at least two sub-pixels are adjacent in the first direction, at least one of the layers of the intermediate layer of the at least two adjacent sub-pixels is integrated and forms a sub-pixel group, and a distance between sub-pixels in the sub-pixel group is smaller than a distance between adjacent sub-pixel groups.

The sub-pixel group may include two to four of the sub-pixels adjacent in the first direction, and at least one of the layers of the intermediate layer of the sub-pixel group may be integrated.

The integrated layers corresponding to the sub-pixels emitting the same color light may be disposed in a zigzag configuration along a second direction perpendicular to the first direction.

The integrated layer may be the light emitting layer.

At least one of the above and other features and advantages may also be realized by providing an organic light emitting display apparatus including a plurality of pixels, each pixel including sub-pixels aligned along a first direction, each sub-pixel emitting red, green, or blue light, wherein at least a part of at least two sub-pixels adjacent in the first direction is integrated, and a distance between the at least two sub-pixels having the same integrated part is smaller than a distance between two sub-pixels that do not include the same integrated part.

At least a part of two to four of the sub-pixels that are adjacent in the first direction may be integrated.

The integrated part may be a light emitting layer.

Each sub-pixel may include a first electrode, a second electrode facing the first electrode, and an intermediate layer disposed between the first and second electrodes and including a plurality of layers including a light emitting layer, and at least one of the layers of each of the intermediate layers of two sub-pixels adjacent in the first direction may be integrated.

The integrated layers corresponding to the sub-pixels emitting the same color light may be disposed in a zigzag configuration along a second direction substantially perpendicular to the first direction.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
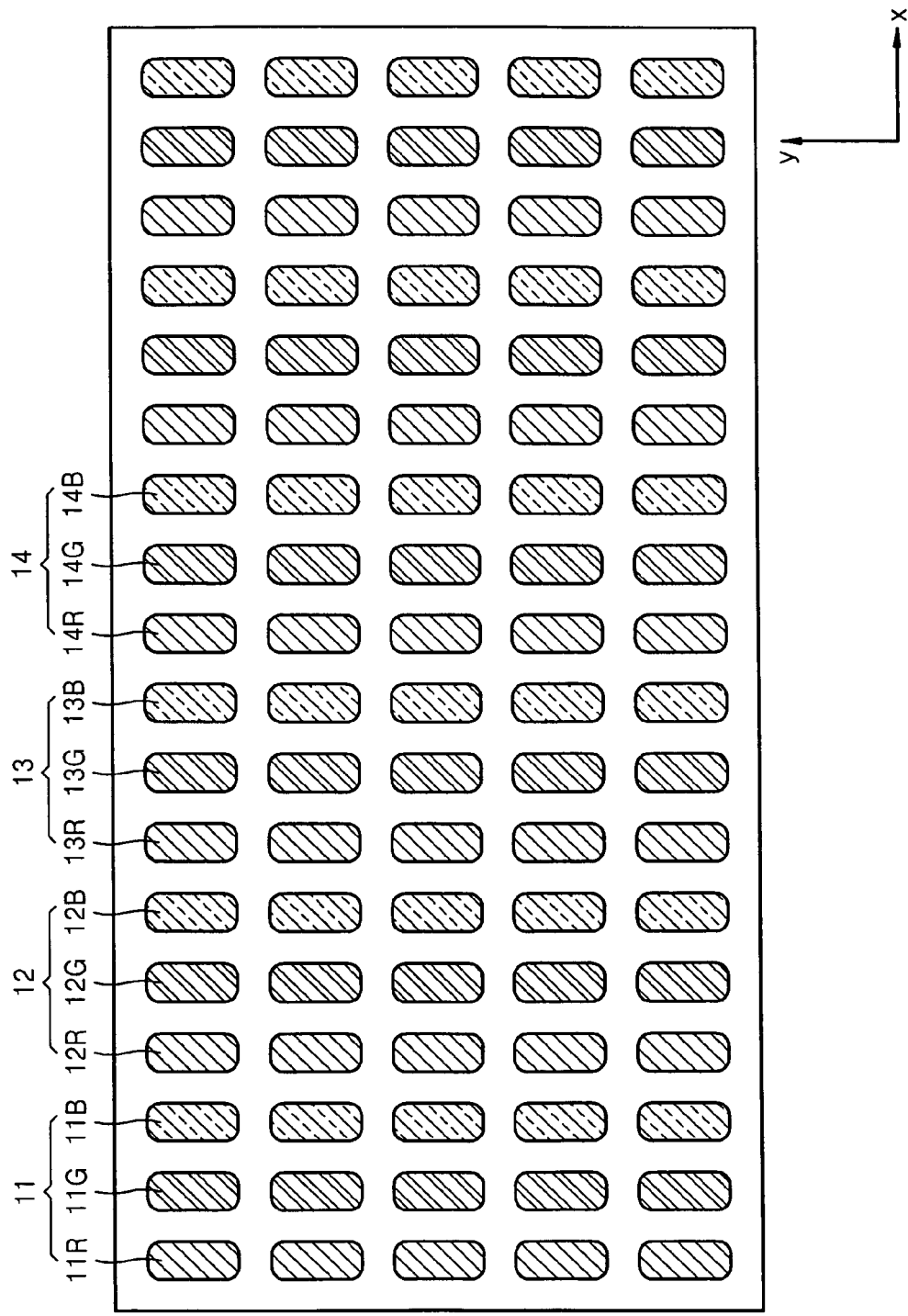
FIG. 1A illustrates a plan view of a pattern of a light emitting layer and intermediate layers of a typical organic light emitting display apparatus.

Korean Patent Application No. 10-2009-0037107, filed on Apr. 28, 2009, in the Korean Intellectual Property Office, and entitled: "Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In a typical organic light emitting display apparatus, it may be very difficult to form a minute pattern on an organic thin film, e.g., a light emitting layer and intermediate layers including the light emitting layer. Also, red, green, and blue light emitting efficiencies may differ according to each layer, and thus satisfactory driving voltage, current density, luminance, color purity, light emitting efficiency, and durability may not be achieved using a typical organic light emitting display.

A typical organic light emitting display apparatus may include a first electrode and a second electrode facing each other. The intermediate layer including the light emitting layer may be disposed between the first and second electrodes. The first and second electrodes and the intermediate layer may be formed by any one of various methods, e.g., a deposition method. When an organic light emitting display apparatus is manufactured using a deposition method, a mask that has the same pattern as the thin film that is to be formed on a surface may be adhered to the surface. The thin film having the pattern may then be formed by depositing a material for the thin film.

Figure 1B:
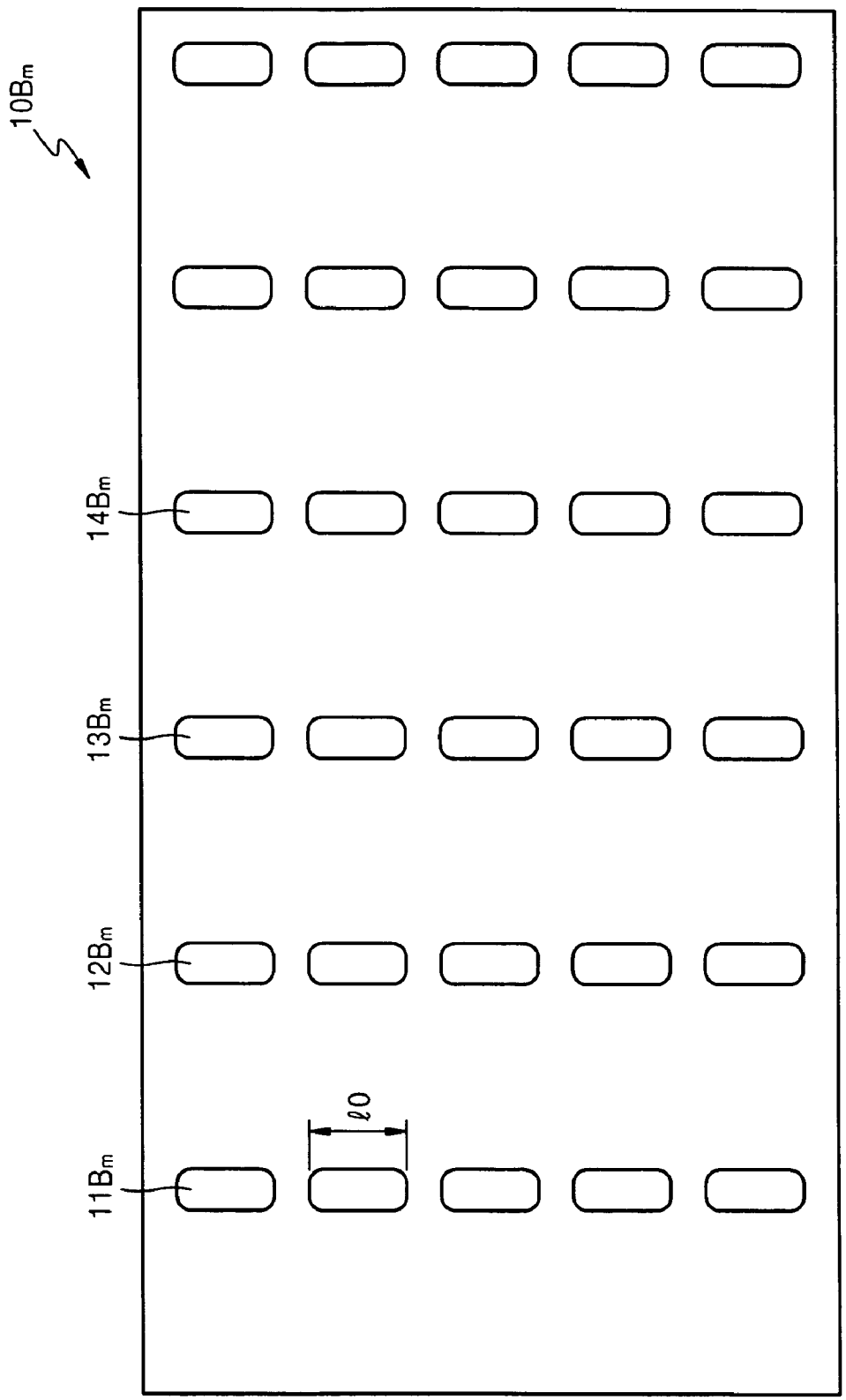
FIG. 1B illustrates a plan view of a mask used to deposit a blue light emitting layer of the typical organic light emitting display apparatus of FIG. 1A.

FIG. 1A illustrates a plan view of a pattern of intermediate layers including intermediate layers 11R, 12R, 13R, 14R, 11G, 12G, 13G, 14G, 11B, 12B, 13B, and 14B of a typical organic light emitting display apparatus. FIG. 1B illustrates a plan view of a mask used to deposit, e.g., the intermediate layers corresponding to the blue pixels, including 11B, 12B, 13B, and 14B, of the typical organic light emitting display apparatus of FIG. 1A.

Referring to FIGS. 1A and 1B, each pixel 11, 12, 13, and 14 of the typical organic light emitting display apparatus may include respective intermediate layers from among the intermediate layers 11R, 12R, 13R, 14R, 11G, 12G, 13G, 14G, 11B, 12B, 13B, and 14B, emitting red, green, and blue light. Here, three adjacent sub-pixels emitting red, green, and blue light may form one pixel.

As described above, intermediate layers of the sub-pixels may be formed, e.g., via deposition using masks. Thus, all intermediate layers of sub-pixels emitting one of red, green, or blue light, e.g., all intermediate layers of sub-pixels emitting red light, may be simultaneously formed via deposition. Then, all intermediate layers of sub-pixels emitting green light may be simultaneously formed via deposition. Then, all intermediate layers of sub-pixels emitting blue light may be simultaneously formed via deposition. The order of deposition of the different intermediate layers is not limited, however. Accordingly, in order to form patterns of blue intermediate layers in the typical organic light emitting display apparatus as illustrated in FIG. 1A, a mask $10B_m$, including openings $11B_m$, $12B_m$, $13B_m$, and $14B_m$ as illustrated in FIG. 1B may be used. Also, in order to form a pattern of red and green intermediate layers as shown in FIG. 1A, masks having openings in an interval identical to, but offset from, that of the openings $11B_m$, $12B_m$, $13B_m$, and $14B_m$ of the mask $10B_m$ as shown in FIG. 1B may be used.

Distances between sub-pixels may be narrowed so as to manufacture a display apparatus having high resolution, and accordingly, a length of openings in the mask for depositing the intermediate layer may be decreased. In other words, referring to FIG. 1B, a length l0 of the openings $11B_m$, $12B_m$, $13B_m$, and $14B_m$ may decrease. Thus, when the length l0 decreases, an area of the light emitting pixel may likewise decrease, and an aperture ratio of the apparatus may decrease. Accordingly, durability of the typical organic light emitting display apparatus may undesirably decrease, and thus it may be difficult to mass-produce an organic light emitting display apparatus having high resolution.

Also, due to high levels of precision required, mask patterning and mask alignment on an area where the intermediate layer is to be deposited may be difficult. In addition, adjacent light emitting layers emitting different colors may overlap if even slight errors occur in alignment.

Display apparatuses, other than an organic light emitting display apparatus, e.g., display apparatuses in which each sub-pixel is prepared via deposition, may also present the above described difficulties.

Figure 2:
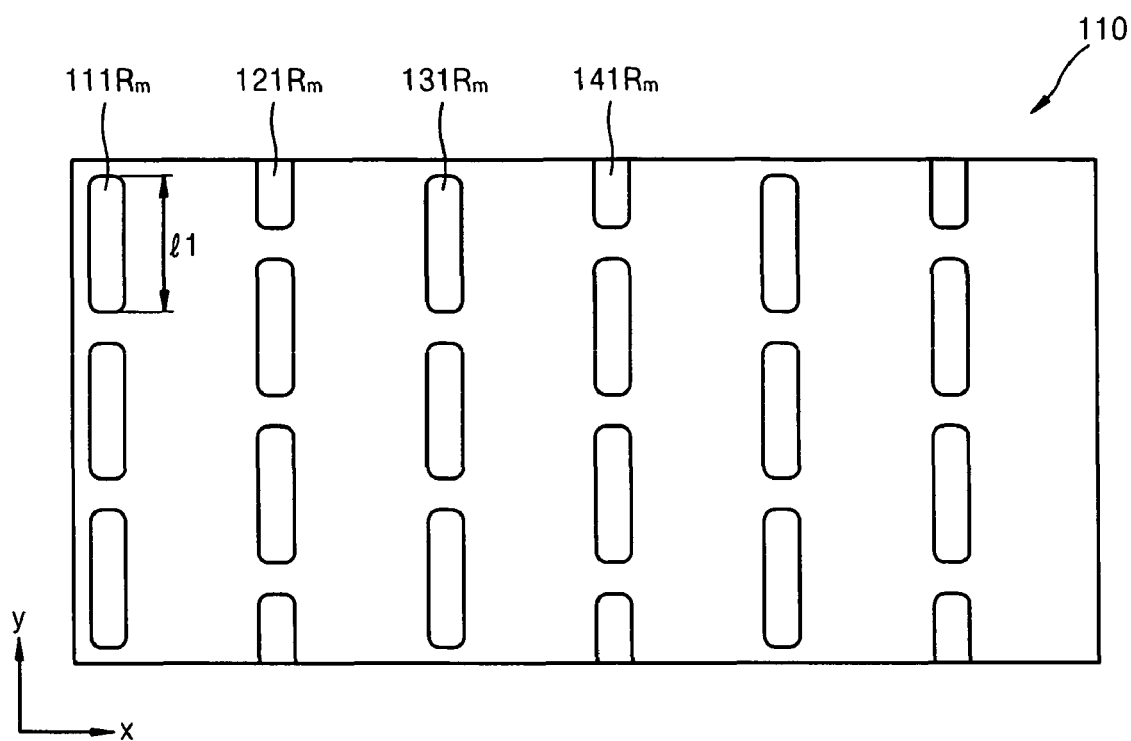
FIG. 2 illustrates a plan view of a mask used to deposit an intermediate layer of an organic light emitting display apparatus according to an embodiment.
Figure 3:
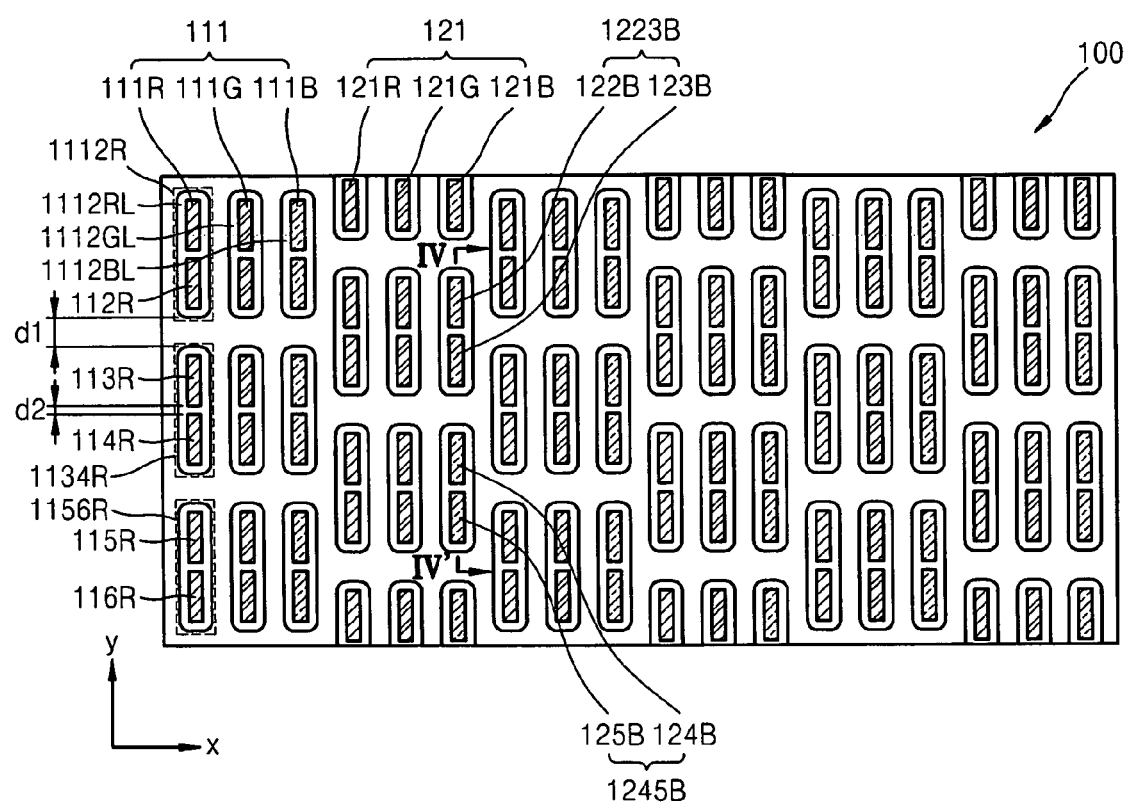
FIG. 3 illustrates a plan view of an organic light emitting display apparatus according to an embodiment.

FIG. 2 illustrates a plan view of a mask 110 for manufacturing an organic light emitting display apparatus according to an embodiment. FIG. 3 illustrates a plan view of pixels of an organic light emitting display apparatus 100 manufactured using the mask 110 of FIG. 2 according to an embodiment.

Referring to FIGS. 2 and 3, an intermediate layer of the organic light emitting display apparatus 100 may be deposited by using the mask 110, which may include openings $111R_m$, $121R_m$, $131R_m$, and $141R_m$ aligned in, e.g., a zigzag configuration. In detail, the organic light emitting display apparatus 100 according to an embodiment may include a plurality of pixels including pixels 111 and 121. The pixel 111 may include sub-pixels 111R, 111G, and 111B emitting red, green, and blue light, respectively. The pixel 121 may include sub-pixels 121R, 121G, and 121B emitting red, green, and blue light, respectively. The sub-pixels may be disposed such that sub-pixels that emit the same color light are aligned along a first direction, e.g., a y-direction of FIG. 3.

Each of the sub-pixels 111R, 121R, 111G, 121G, 111B, and 121B may include first and second electrodes facing each other and the intermediate layer disposed between the first and second electrodes. The intermediate layer may include a plurality of layers including, e.g., a light emitting layer. The intermediate layer may also include, e.g., an electron injection layer, an electron transport layer, a hole transport layer, and a hole injection layer. The shape of the intermediate layer of an embodiment may be different from that of the intermediate layer of the typical organic light emitting display apparatus. In other words, at least one layer of the intermediate layer, e.g., the light emitting layer, of each of two sub-pixels adjacent in the y-direction may be integrated with each other, so as to form a pixel group. In other words, a single layer of the intermediate layer may correspond to at least two adjacent sub-pixels of a pixel, i.e., a pixel group. In FIG. 3, reference numerals 1112R, 1134R, 1156R, 1223B, and 1245B each denote a pixel group. That is, at least one layer of the intermediate layer of each of the sub-pixel 111R and the sub-pixel 112R adjacent to the sub-pixel 111R may be integrated, so as to form the pixel group 1112R. Similarly, at least one layer of the intermediate layer of each of the sub-pixel 113R and the sub-pixel 114R adjacent to the sub-pixel 113R may be integrated, so as to form the pixel group 1134R.

Here, in the organic light emitting display apparatus 100 according to an embodiment, a distance between sub-pixels in a pixel group may be less than a distance between adjacent pixel groups. For example, as shown in FIG. 3, the distance d2 between the sub-pixels 111R and 112R in the pixel group 1112R may be smaller than the distance d1 between the adjacent pixel groups 1112R and 1134R.

By grouping a plurality of sub-pixels, the distance between sub-pixels in the same group may be minimized, and the distance between adjacent pixel groups may be greater than the distance between sub-pixels in the same pixel group. Accordingly, undesirable aperture ratio reduction associated with a typical dot type mask may be minimized.

The integrated layers of pixel groups of sub-pixels emitting the same color may be disposed in, e.g., a zigzag configuration, along a second direction, i.e., in an x-direction of FIG. 3. As described above, the intermediate layer may include a plurality of layers, at least one of which is the light emitting layer. Accordingly, integrated layers 1112RL, 1112GL, and 1112BL of FIG. 3 may be light emitting layers. By disposing pixel groups in the zigzag configuration, uniformity of quality may be improved.

Also, by disposing the intermediate layer of the organic light emitting display apparatus 100 as described above, openings in the mask 110 used during deposition of the intermediate layer may be disposed in the zigzag configuration as shown in FIG. 2, and thus the mask 110 may be easily formed, compared to a typical mask having dotted openings. Also, by disposing the openings in the zigzag configuration, undesirable changes in shapes and locations of the openings due to, e.g., lowered tensile strength, may be smaller than changes in shapes and locations of typical striped openings. Accordingly, a manufacturing yield of the organic light emitting display apparatus may be increased.

In other words, when the mask 110 as shown in FIG. 2 is used, a length l1 of each of the openings $111R_m$, $121R_m$, $131R_m$, and $141R_m$ of the mask 110 may be about twice the length l0 of each of the openings $11B_m$ and $12B_m$ of the typical mask $10B_m$ of FIG. 1. Accordingly, difficulties in manufacturing and aligning the mask 110 may be decreased, thereby increasing yield and reducing manufacturing costs while manufacturing a display apparatus having high resolution and high quality.

Figure 4:
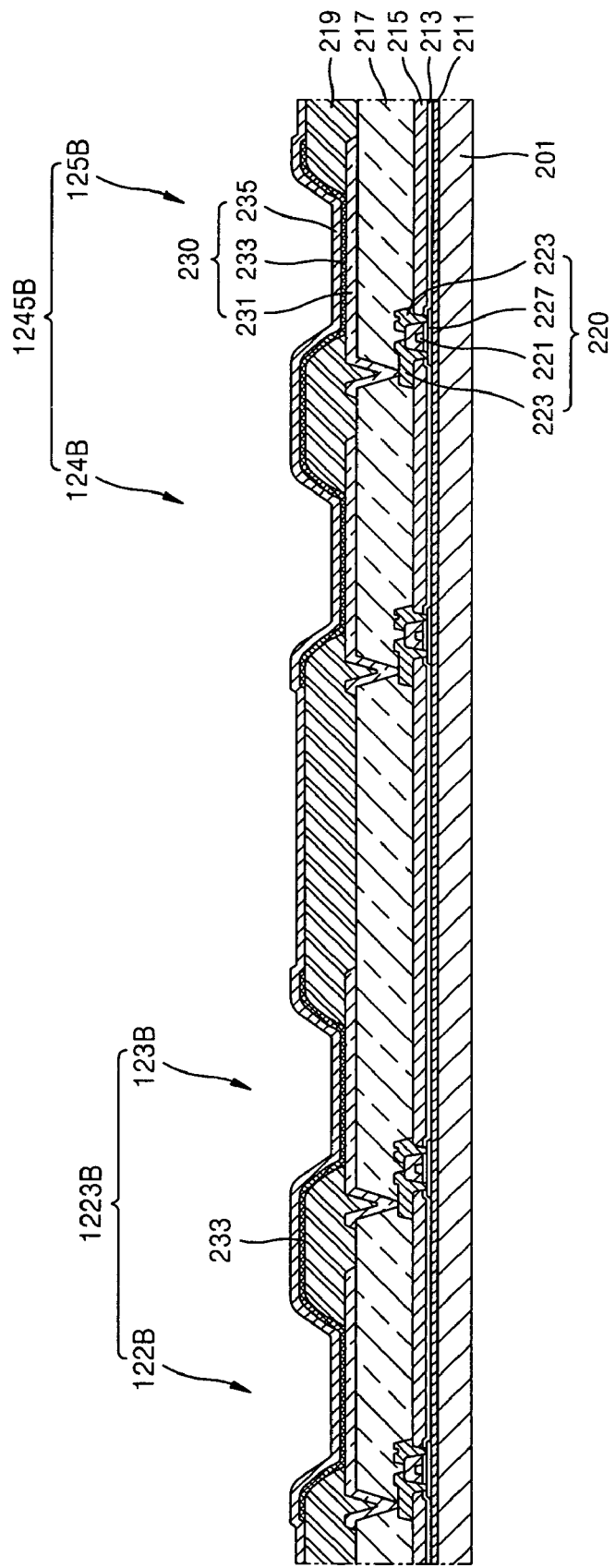
FIG. 4 illustrates a cross-sectional view taken along a line IV-IV' of FIG. 3.

FIG. 4 illustrates a cross-sectional view taken along a line IV-IV' of FIG. 3. Referring to FIG. 4, the organic light emitting display apparatus 100 according to the present embodiment may include a substrate 201 and a buffer layer 211 on the substrate 201. A thin film transistor 220 may be disposed on the buffer layer 211, and an organic light emitting device 230 may be disposed on the thin film transistor 220.

The thin film transistor 220 may include a gate electrode 221, a source and drain electrode 223, a semiconductor layer 227, a gate insulation layer 213, and an interlayer insulation layer 215. Also, a planarization layer (or a protection layer) 217 may be disposed on the source and drain electrode 223, to protect and planarize the thin film transistor 220 thereunder. The organic light emitting device 230 may be disposed on the planarization layer 217. The organic light emitting device 230 may include a pixel electrode 231 electrically connected to the thin film transistor 220, a facing electrode 235 disposed on an entire surface of the organic light emitting display apparatus 100, and an intermediate layer 233 disposed between the pixel electrode 231 and the facing electrode 235. The intermediate layer 233 may include a plurality of layers including, e.g., a light emitting layer. The intermediate layer 233 may also include, e.g., an electron injection layer, an electron transport layer, a hole transport layer, and a hole injection layer. A pixel defining layer (PDL) 219 may cover ends of the pixel electrode 231. The PDL 219 may define a light emitting area by having a predetermined thickness between the pixel electrodes 231.

At least one layer of the intermediate layer 233, e.g., the light emitting layer, of each of at least two sub-pixels adjacent in one direction may be integrated to form one pixel group. Referring to FIG. 4, two adjacent sub-pixels 122B and 123B may form a pixel group 1223B, and the intermediate layers 233 of the sub-pixels 122B and 123B may be integrated. Also, two neighboring sub-pixels 124B and 125B may form a pixel group 1245B, and the intermediate layers 233 of the sub-pixels 124B and 125B may be integrated.

Although not illustrated in FIG. 4, the thin film transistor 220 may be connected to at least one capacitor. Also, a circuit including the thin film transistor 220 is not limited to the example illustrated in FIG. 4, and may be variously modified.

In the organic light emitting display apparatus 100 including the organic light emitting devices 230, the layers included in the intermediate layer 233 may be arranged as described above, and thus the intermediate layer 233 of each pixel may be easily deposited. Thus, the organic light emitting display apparatus 100 having high resolution and high pattern precision may be manufactured.

The embodiments are described based on a structure of an organic light emitting display apparatus, but the embodiments may be applied to any display apparatus where pixels are prepared via deposition.

Figure 5:
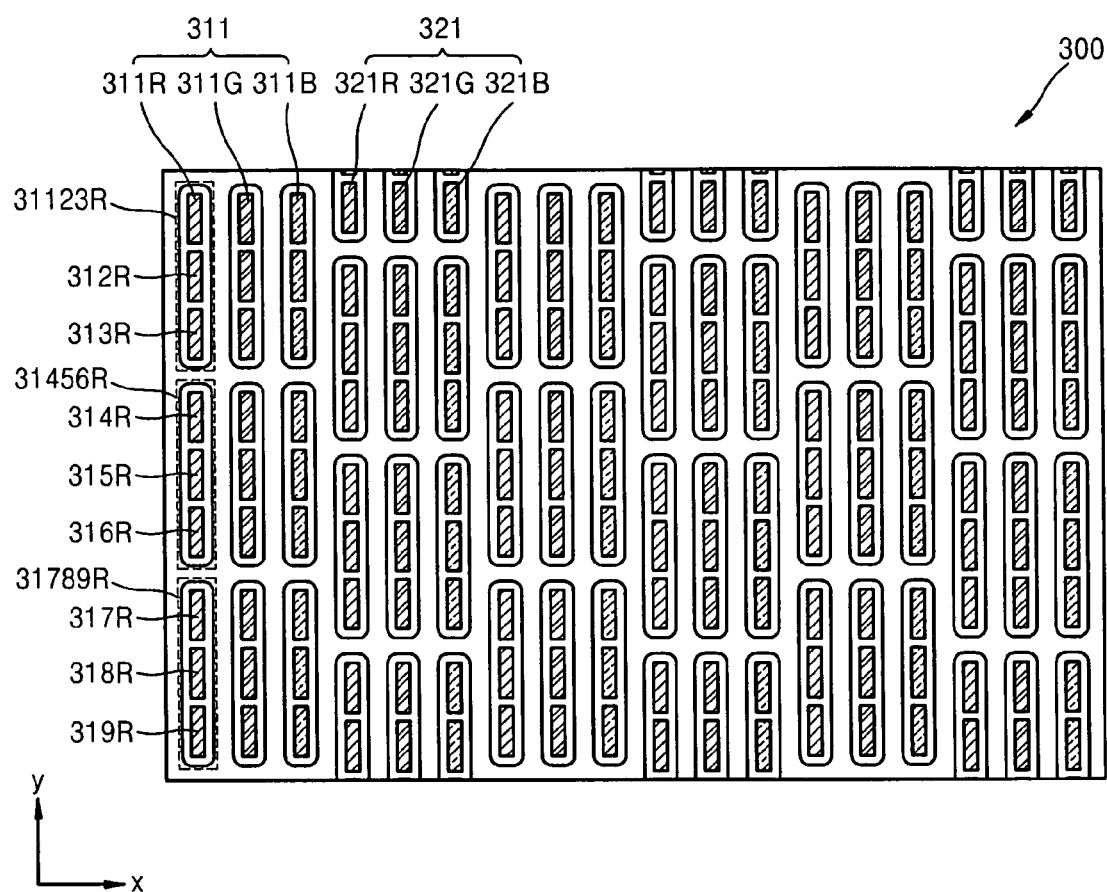
FIG. 5 illustrates a plan view of an organic light emitting display apparatus according to another embodiment.

FIG. 5 illustrates a plan view of an organic light emitting display apparatus 300 according to another embodiment. The present embodiment differs from the previous embodiment by including three sub-pixels in one pixel group.

Referring to FIG. 5, the organic light emitting display apparatus 300 may include a plurality of pixels including pixels 311 and 321. The pixel 311 may include sub-pixels 311R, 311G, and 311B emitting red, green, and blue light, respectively. The pixel 321 may include sub-pixels 321R, 321G, and 321B emitting red, green, and blue light, respectively. The sub-pixels may be disposed such that sub-pixels that emit the same color light are aligned along a first direction, e.g., a y-direction of FIG. 5. Each of the sub-pixels 311R, 321R, 311G, 321G, 311B, and 321B may include first and second electrodes facing each other, and an intermediate layer disposed between the first and second electrodes. The intermediate layer may include a plurality of layers including, e.g., a light emitting layer. The intermediate layer may also include, e.g., an electron injection layer, an electron transport layer, a hole transport layer, and a hole injection layer.

Here, at least one layer of the intermediate layer of each of three adjacent sub-pixels of a pixel group aligned in the y-direction may be integrated. In FIG. 5, reference numerals 31123R, 31456R, and 31789R denote pixel groups.

In the organic light emitting display apparatus 300 according to the present embodiment, the distance between sub-pixels in a pixel group may be smaller than the distance between adjacent pixel groups. For example, the distance between the sub-pixels 311R, 312R, and 313R in the pixel group 31123R may be smaller than the distance between adjacent pixel groups 31123R and 31456R.

As such, by grouping a plurality of sub-pixels, the distance between sub-pixels in the same pixel group may be minimized, and the distance between adjacent pixel groups may be increased. This may minimize undesirable aperture ratio reduction associated with a typical dot type mask.

Figure 6:
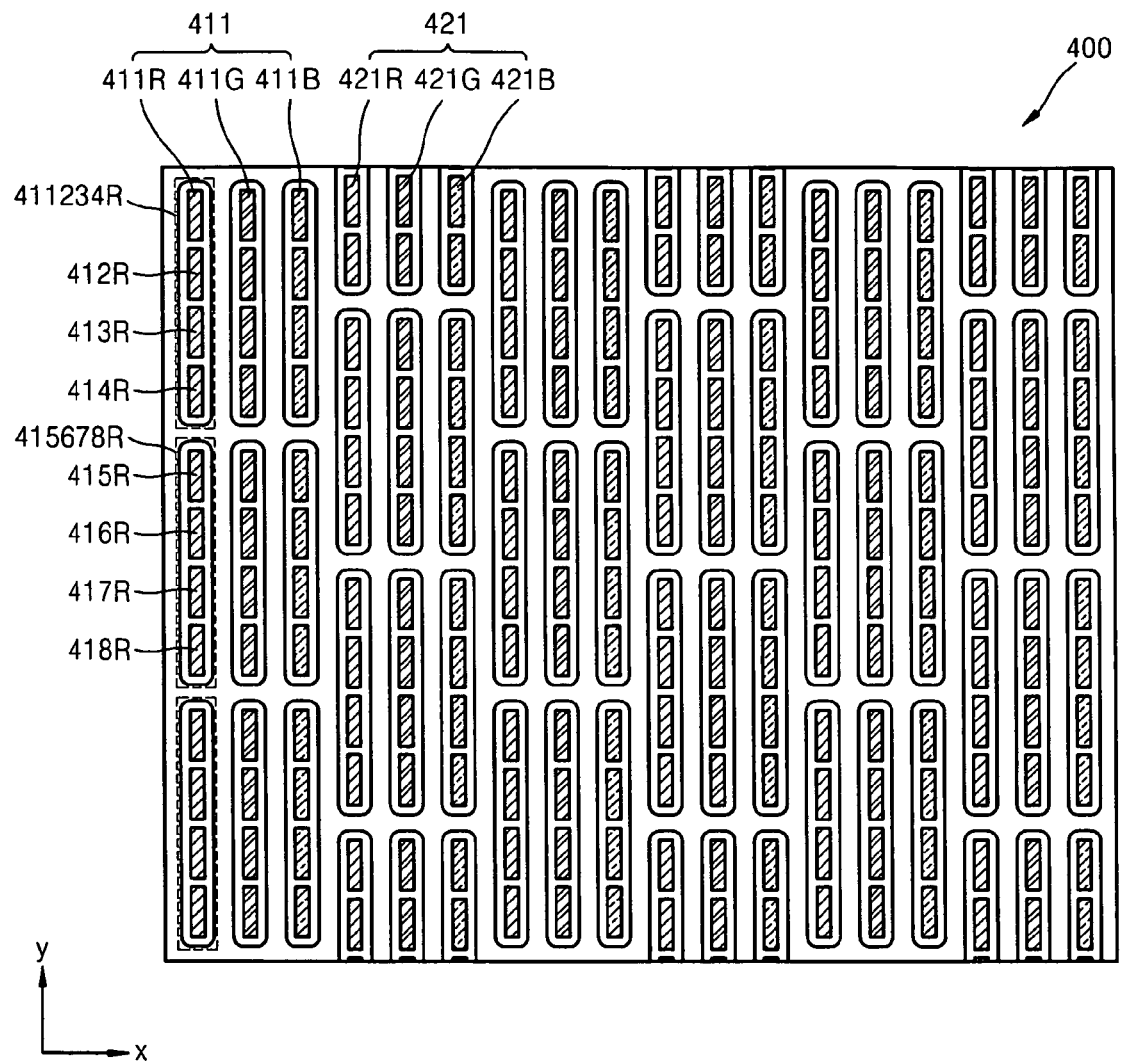
FIG. 6 illustrates a plan view of an organic light emitting display apparatus according to yet another embodiment.

FIG. 6 illustrates a plan view of an organic light emitting display apparatus 400 according to yet another embodiment. The present embodiment differs from the previous embodiments by having four sub-pixels in one pixel group.

Referring to FIG. 6, the organic light emitting display apparatus 400 may include a plurality of pixels including pixels 411 and 421. The pixel 411 may include sub-pixels 411R, 411G, and 411B emitting red, green, and blue light, respectively. The pixel 421 may include sub-pixels 421R, 421G, and 421B emitting red, green, and blue light, respectively. Here, the sub-pixels 411R, 421R, 411G, 421G, 411B, and 421B may be disposed to emit the same color light along a first direction, e.g., a y-direction of FIG. 6. Each of the sub-pixels 411R, 421R, 411G, 421G, 411B, and 421B may include first and second electrodes facing each other and an intermediate layer disposed between the first and second electrodes. The intermediate layer may include a plurality of layers including, e.g., a light emitting layer. The intermediate layer may also include, e.g., an electron injection layer, an electron transport layer, a hole transport layer, and a hole injection layer.

Here, at least one layer of the intermediate layer, e.g., the light emitting layer, of each of the four sub-pixels adjacent in the y-direction may be integrated so as to form a pixel group. In FIG. 6, reference numerals 411234R and 415678R denote pixel groups.

In the organic light emitting display apparatus 400 according to the present embodiment, a distance between sub-pixels in a pixel group may be smaller than a distance between adjacent pixel groups. For example, the distances between the sub-pixels 411R, 412R, 413R, and 414R in the pixel group 411234R may be smaller than the distance between adjacent pixel groups 411234R and 415678R.

Thus, by grouping a plurality of sub-pixels, the distance between sub-pixels in the same pixel group may be minimized. Thus, the distance between adjacent pixel groups may be increased, thereby minimizing undesirable aperture ratio reduction associated with a typical dot type mask.

Accordingly, in the display apparatus of an embodiment, the aperture ratio of each pixel may be increased, thereby maximizing, e.g., durability and productivity of the display apparatus.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus, comprising:
a plurality of pixels, wherein:
each pixel includes:
a first electrode,
a second electrode facing the first electrode, and
an intermediate layer disposed between the first and second electrodes and including a plurality of layers including a light emitting layer,
at least two pixels adjacent in a first direction form a pixel group,
at least one of the layers of the intermediate layer of the at least two adjacent pixels of the pixel group is integrated such that the at least one integrated layer in each of the pixels provides a plurality of integrated layers,
a distance between pixels in the pixel group is smaller than a distance between adjacent pixel groups, and
the integrated layers are disposed in a zigzag configuration along a second direction perpendicular to the first direction such that, in the second direction, one of the pixel groups only partially overlaps with a next-closest pixel group.

2. The organic light emitting display apparatus as claimed in claim 1, wherein:
the pixel group includes two to four pixels adjacent in the first direction, and
at least one of the layers of the intermediate layer of the pixel group is integrated.

3. The organic light emitting display apparatus as claimed in claim 1, wherein the integrated layer is the light emitting layer.

4. An organic light emitting display apparatus, comprising:
a plurality of pixels, wherein:
each pixel includes sub-pixels,
each sub-pixel emits red, green, or blue light,
the sub-pixels are disposed to emit the same color light along a first direction,
each sub-pixel includes:
a first electrode;
a second electrode facing the first electrode; and
an intermediate layer disposed between the first and second electrodes and including a plurality of layers including a light emitting layer,
at least two sub-pixels are adjacent in the first direction,
at least one of the layers of the intermediate layer of the at least two adjacent sub-pixels is integrated and forms a sub-pixel group such that the at least one integrated layer in each of the pixels provides a plurality of integrated layers,
a distance between sub-pixels in the sub-pixel group is smaller than a distance between adjacent sub-pixel groups, and
the integrated layers corresponding to the sub-pixels emitting the same color light are disposed in a zigzag configuration along a second direction perpendicular to the first direction such that, in the second direction, one of the pixels only partially overlaps with a next-closest pixel.

5. The organic light emitting display apparatus as claimed in claim 4, wherein:
the sub-pixel group includes two to four of the sub-pixels adjacent in the first direction, and
at least one of the layers of the intermediate layer of the sub-pixel group is integrated.

6. The organic light emitting display apparatus as claimed in claim 4, wherein the integrated layer is the light emitting layer.

7. An organic light emitting display apparatus, comprising:
a plurality of pixels, each pixel including:
sub-pixels aligned along a first direction, each sub-pixel emitting red, green, or blue light, wherein:
at least a part of at least two sub-pixels adjacent in the first direction is integrated to form integrated layers,
a distance between the at least two sub-pixels having the same integrated part is smaller than a distance between two sub-pixels that do not include the same integrated part, and
the integrated layers corresponding to the sub-pixels emitting the same color light are disposed in a zigzag configuration along a second direction perpendicular to the first direction such that, in the second direction, one of the pixels only partially overlaps with a next-closest pixel.

8. The organic light emitting display apparatus as claimed in claim 7, wherein at least a part of two to four of the sub-pixels that are adjacent in the first direction is integrated.

9. The organic light emitting display apparatus as claimed in claim 7, wherein the integrated part is a light emitting layer.

10. The organic light emitting display apparatus as claimed in claim 7, wherein:

each sub-pixel includes:
- a first electrode;
- a second electrode facing the first electrode; and
- an intermediate layer disposed between the first and second electrodes and including a plurality of layers including a light emitting layer, and at least one of the layers of each of the intermediate layers of two sub-pixels adjacent in the first direction is one of the integrated layers.

* * * * *